United States Patent [19]

Hueckel et al.

[11] Patent Number: 4,577,212
[45] Date of Patent: Mar. 18, 1986

[54] STRUCTURE FOR INHIBITING FORWARD BIAS BETA DEGRADATION

[75] Inventors: Gary R. Hueckel, Wappingers Falls; George S. Prokop, Fishkill, both of N.Y.

[73] Assignee: International Business Machines Corporation, Armonk, N.Y.

[21] Appl. No.: 626,274

[22] Filed: Jun. 29, 1984

[51] Int. Cl.[4] .................... H01L 29/52; H01L 29/54; H01L 23/50
[52] U.S. Cl. ........................................ 357/68; 357/65; 357/67; 357/71; 357/34
[58] Field of Search ........................ 357/65, 34, 67, 68, 357/71

[56] References Cited

U.S. PATENT DOCUMENTS 3,702,427 11/1972 Learn et al. .......................... 357/65
3,716,469 2/1973 Bhatt et al. ........................... 357/54
3,813,263 5/1974 Rosenberg ............................ 29/590
3,848,330 11/1974 Hall et al. ............................ 148/127
4,017,890 4/1977 Howard et al. ....................... 357/68
4,121,241 10/1978 Drake et al. .......................... 357/68

OTHER PUBLICATIONS

IBM TDB, vol. 13, No. 7, Dec. 1970, pp. 2011 and 2014.
Thin Solid Films, 46, (1977), pp. 139–150.
Applied Physics Letters, vol. 29, No. 3, Aug. 1, 1970, pp. 131–133.
Applied Physics Letters, vol. 30, No. 8, Apr. 15, 1977, pp. 387–389.
Journal of Applied Physics, vol. 53, No. 6, 1982, pp. 4456–4462.

Primary Examiner—Andrew J. James
Assistant Examiner—E. Fallick
Attorney, Agent, or Firm—Robert J. Haase

[57] ABSTRACT

An emitter contact structure is disclosed for alleviating forward bias beta degradation in a bipolar transistor. The structure comprises emitter contact metallurgy which travels over a dielectric insulating layer having an area of increased thickness adjacent to the area of contact between the metallurgy and the emitter.

4 Claims, 3 Drawing Figures

STRUCTURE FOR INHIBITING FORWARD BIAS BETA DEGRADATION

BACKGROUND OF THE INVENTION

1. Field of the Invention

The present invention generally relates to forward bias beta degradation in bipolar transistors and, more particularly, to an emitter contact structure for inhibiting such degradation when attributable to electromigration of the contact metallurgy.

2. Description of the Prior Art

It is generally well understood that long aluminum stripes, customarily used in making contact to bipolar and other semiconductor devices have relatively short lifetimes, due to electromigration, as compared to shorter stripes. Segmented stripes to increase electromigration resistance by reducing solute concentration depletion and by reducing extrusion pressure are disclosed in Invention Disclosure Bulletins on segmented stripe devices by N. G. Ainslie et al, IBM® Technical Disclosure Bulletin dated December 1970, pp. 2011 and 2014, respectively. However, the electromigration impact on the semiconductor devices, which are connected to the metallurgy subjected to electromigration, is not addressed. Similar findings as to the relationship between the amount of electromigration and the length of the conductor being subjected to electromigration forces are discussed in the paper "Threshold Current Density and Incubation Time to Electromigration in Gold Films" by E. Kinsbron et al, Thin Solid Films, 46 (1977), pp. 139–150.

Stress gradients, in metallurgy subjected to electromigration, oppose electromigration according to the analyses given in the papers "Stress Generation by Electromigration" by I. A. Blech et al, Applied Physics Letters, Vol. 29, No. 3, Aug. 1, 1976, pp. 131–133 and "Measurement of Stress Gradients Generated by Electromigration" By I. A. Blech et al, Applied Physics Letters, Vol. 30, No. 8, Apr. 15, 1977, pp. 387–389.

It is also known that electromigration of contact metallurgy causes a stress build-up at the emitter contact of a bipolar transistor with a consequent reduction in the current amplification factor ($\beta$) of the transistor. This is discussed in the paper "The Relationship Among Electromigration, Passivation Thickness, and Common-Emitter Current Gain Degradation Within Shallow Junction NPN Bipolar Transistors" by R. S. Hemmert et al, Journal of Applied Physics, Vol. 53, No 6, pp. 4456–4462, 1982.

SUMMARY OF THE INVENTION

Forward bias beta degradation, associated with electromigration-induced emitter stress in a bipolar transistor, is inhibited by routing the emitter connection metallurgy over an insulating bump located close to the emitter. The bump causes electromigration hillock build-up at the same point in the overlying metallurgy and relieves such build-up stress at the emitter contact.

BEST MODE FOR CARRYING OUT THE INVENTION

Future bipolar transistors, characterized by decreasing emitter-base junction depths and base widths and by increasing emitter current densities, will be increasingly prone to forward bias beta degradation. As emitter depth decreases, the transistor's beta becomes more sensitive to mechanical stress that affects the band-gap. Band gap changes caused by externally applied mechanical stress from electromigration-induced compressive stress in the emitter contact is discussed in the aforementioned paper by R. S. Hemmert et al. Emitter efficiency is adversely altered and the device is degraded. The elimination of the electromigration induced stress in the emitter contact, in accordance with the present invention, greatly increases the reliability of the bipolar transistor and the conditions under which the transistor can be used.

Figure 1A:
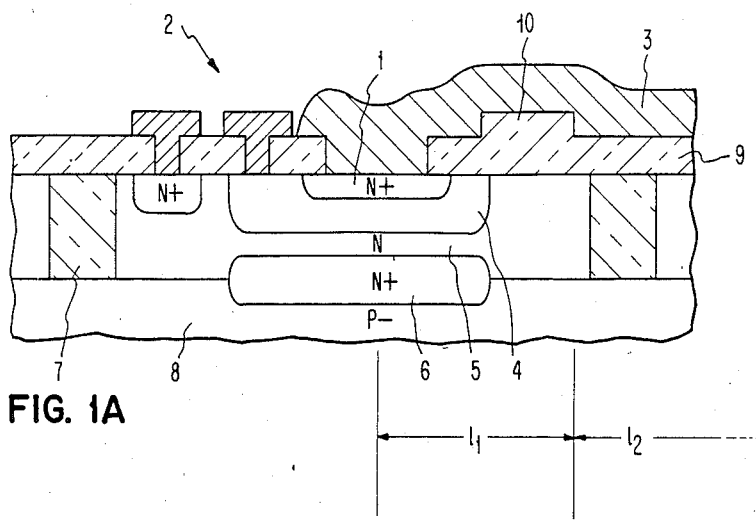
FIGS. 1A and 1B are simplified cross-sectional and plan views respectively, of the emitter contacting structure of the present invention.
Figure 1B:
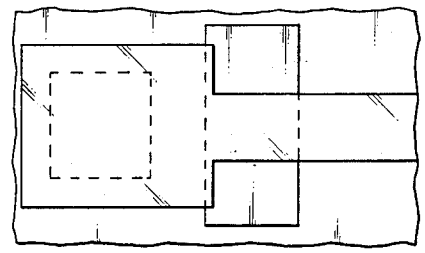

Referring to FIG. 1A, emitter area 1 of a bipolar transistor 2 is contacted by CrAlCu metallurgy stripe 3. Briefly, exemplary transistor 2 is shown as a conventional NPN device comprising base 4, collector 5 with subcollector 6 and dielectric isolation 7 on P-substrate 8.

Stripe 3 which, in accordance with the present invention, is provided with a bump 10 of dielectric material a distance $l_1$ removed from the emitter contact area per se. In a typical instance, a value of about 5 $\mu$m to about 10 $\mu$m has been found to be appropriate for $l_1$, where the underlying dielectric material 9 is $SiO_2$, the thickness of the $SiO_2$ bump is in the range of about 4000 Å to about 5000 Å, and the thickness of CrAlCu stripe 3 is about 1 $\mu$m. The bump 10 can be formed in a number of ways. One suitable technique is to deposit $SiO_2$ on top of dielectric material 9 and then reactively ion etch away all of the deposited $SiO_2$ except at the desired location of the bump. It has been observed that the electromigration of CrAlCu into the emitter contact area is significantly slowed by the presence of bump 10, relative to the amount of electromigration encountered at the emitter in the absence of the bump. It is believed that by the division of the contact metallurgy into the two regions of $l_1$ and $l_2$, the electromigration from the region $l_2$ will be stopped at and accumulate upon bump 10 because of stress concentration at that location and will not reach the emitter contact area. Only the region $l_1$ will be able to migrate into the contact area but the amount of migration will be limited by the length ($l_1$) effect. Length effect is generally discussed in the aforementioned publications by N. G. Ainslie et al and E. Kinsbron et al. Thus, the amount of electromigration into the emitter contact area is substantially reduced, causing a smaller amount of stress and degradation than would be the case if the bump 10 were not present.

Figure 2:
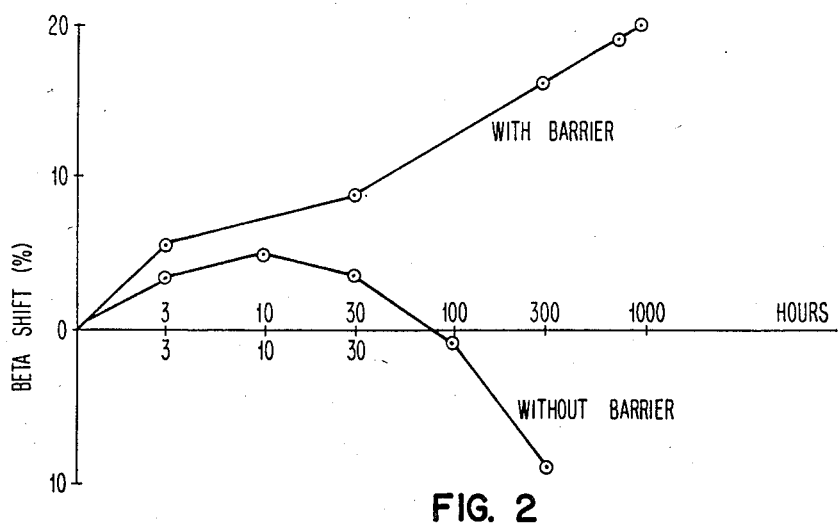
FIG. 2 is a set of superimposed curves showing forward bias beta variation due to electromigration in bipolar transistors using the structure of FIG. 1 in contrast to transistors not using said structure.

In a test of two identical bipolar transistors having an emitter size of 15 $\mu m^2$ and subjected to emitter current density of 0.5 ma/$\mu m^2$ at 160° C. operating temperature over a period of hours, the transistor equipped with an electromigration barrier or bump beneath the emitter contact metallurgy demonstrated the superior beta change characteristic depicted in FIG. 2, relative to the transistor not so equipped. It will be noted that whereas the conventional emitter contact metallurgy exhibited a net beta loss after 350 hours, the beta of the transistor with the electromigration barrier actually continued to increase after 350 hours.

In another test using an order of magnitude higher emitter current density, the results shown in the following table were obtained from two identical transistors, differing only to the extent that one was equipped with the electromigration barrier and the other was not, as is indicated. It can be seen that a beta degradation of $-10\%$ was observed after 133 hours on stress for the transistor having no barrier as compared to a 10% beta increase after 300 hours on stress for the transistor having the barrier.

|  | Beta Shift (%) | WITH BARRIER | |
| --- | --- | --- | --- |
| Stress Hrs | 100 $\mu aI_c$ | 1maI$_c$ | 5maI$_c$ |
| 16 | 5.4 | 8.3 | 13.1 |
| 44 | 5.T | 8.9 | 13.6 |
| 133 | 5.85 | 9.3 | 13.8 |
| 300 | 10.01 | 8.5 | 14.0 |
| Ohr Beta | 85.3 | 78.4 | 60.8 |

Emitter Size = 3 × 5 $\mu m^2$
Stress = 200° C.
5mA/$\mu m^2$

|  |  | WITHOUT BARRIER | |
| --- | --- | --- | --- |
| Stress Hrs. | 100 $\mu aI_c$ | 1maI$_c$ | 5maI$_c$ |
| 24 | −5.16 | −3.18 | −1.1 |
| 47 | −7.15 | −4.88 | −2.67 |
| 67 | −8.37 | −6.05 | −3.8 |
| 133 | −10.00 | −6.94 | −4.5 |
| Ohr Beta | 85.9 | 82.6 | 70.26 |

Emitter Size = 3 × 5 $\mu m^2$
Stress = 200° C.
5mA/$\mu m^2$

We claim:

1. In a bipolar transistor susceptible to forward bias beta degradation associated with electromigration-induced emitter contact stress, means for alleviating said stress at said emitter, said means comprising emitter contact, insulated metallurgy means for concentrating electromigration-induced stress in said metallurgy in an area adjacent to the area of contact between said metallurgy and said emitter,
   said insulated metallurgy means comprising,
   a layer of insulating material through which an opening is formed for contacting said emitter and metallurgy on said
   insulating layer for contacting said emitter through said opening,
   said layer having an area of increased thickness adjacent to said opening,
   said metallurgy contacting said emitter through said opening after traversing said area.

2. The structure defined in claim 1 wherein said area has a thickness in the range of about 4000 Å to about 5000 Å.

3. The structure defined in claim 2 wherein said contacting metallurgy is CrAlCu of a thickness of about 1 $\mu$m.

4. The structure defined in claim 1 wherein said area is spaced from the center of said opening a distance in the range from about 5 $\mu$m to about 10 $\mu$m.

* * * * *